United States Patent [19]

Giglia

[11] Patent Number: 4,488,781

[45] Date of Patent: Dec. 18, 1984

[54] METHOD FOR MANUFACTURING AN ELECTROCHROMIC DISPLAY DEVICE AND DEVICE PRODUCED THEREBY

[75] Inventor: Robert D. Giglia, Rye, N.Y.

[73] Assignee: American Cyanamid Company, Stamford, Conn.

[21] Appl. No.: 342,441

[22] Filed: Jan. 25, 1982

[51] Int. Cl.³ ............................................. G02F 1/01
[52] U.S. Cl. ................................... 350/357; 427/259; 430/319
[58] Field of Search .......................... 350/357; 29/570; 430/29, 304, 315, 319, 321; 156/655–656; 204/15, 385; 427/108–109, 266, 259

[56] References Cited

U.S. PATENT DOCUMENTS

| 3,853,715 | 12/1974 | Romankiw | 156/656 |
| 4,123,841 | 11/1978 | Yano et al. | 350/357 |
| 4,127,853 | 11/1978 | Leibowitz | 350/357 |
| 4,174,152 | 11/1979 | Giglia et al. | 350/357 |
| 4,257,684 | 3/1981 | Nishiyama | 350/357 |
| 4,280,754 | 7/1981 | Yano et al. | 350/357 |
| 4,320,190 | 3/1982 | Ruedin | 430/319 |
| 4,326,929 | 4/1982 | Minezaki et al. | 204/15 |
| 4,375,318 | 3/1983 | Giglia | 350/357 |
| 4,375,319 | 3/1983 | Wada et al. | 350/357 |

FOREIGN PATENT DOCUMENTS

| 38947 | 3/1977 | Japan | 350/357 |
| 2067330 | 7/1981 | United Kingdom | 350/357 |

OTHER PUBLICATIONS

Giglia et al., "Performance Improvements in $WO_3$-Based Electrochromic Displays", Conf.: 1981 Sid Intern. Sym. Digest of Papers, Vol. XII, New York, U.S.A. 28-30 Aug. 1981, pp. 76-77.

Primary Examiner—William H. Punter
Attorney, Agent, or Firm—Gordon L. Hart

[57] ABSTRACT

An electrochromic display matrix and method for making the same are disclosed wherein relatively small spacing distances between the individual electrochromic elements can be obtained. The method comprises exposing and developing photoresist through a pattern which defines strips and relatively narrow spacing distances. Solvent-permeable ion-conductive material and then solvent-permeable conductive material are applied over the photoresist. Photoresist solvent-remover is then applied, which releases the underlying photoresist and lifts off the ion-conductive material and conductive material to establish isolated regions of ion-conductive material and conductive material. Insulating paint is then applied in order to maintain isolation between the strips. The completed device, when addressed by a multiplexing method, is substantially free of any cross talk effects. High resolution display matrices are obtainable.

22 Claims, 5 Drawing Figures

METHOD FOR MANUFACTURING AN ELECTROCHROMIC DISPLAY DEVICE AND DEVICE PRODUCED THEREBY

TECHNICAL FIELD OF THE INVENTION

This invention relates to electrochromic display devices, and more particularly to a method of producing an electrochromic dot matrix display having relatively closely spaced dots of an electrochromic material in an X-Y matrix and the device produced thereby.

BACKGROUND OF THE INVENTION

Electrochromic display devices have been used to display data in various formats. When the display device incorporates a number of electrochromic elements in a two-dimensional matrix configuration, the individual electrochromic elements typically are arranged in a manner suitable for multiplex addressing. However, in a multiplex addressed system, alternate current paths are created, which result in undesired coloration or bleaching of electrochomic elements adjacent to an electrochromic element sought to be colored or bleached, an effect commonly referred to as cross talk. Attempts have been made to deal with the cross talk problem. For example, commonly assigned U.S. Pat. No. 4,129,861 discloses the use of diode elements to increase the threshold voltage of each electrochromic element. However, in order to use multiplex addressing in such an arrangement, each electrochromic element must be provided with such a diode means, which, of course, increases the cost and complexity of the device.

Other attempts to deal with the cross talk problem have included forming the ion-conductive electrolyte layers and counter-electrode material in separate strips to minimize alternate current paths. However, in a high resolution matrix where the individual electrochromic elements or dots must be small and closely spaced in order to display typewritersized characters for example, it is difficult to control the size of the gap between the strips of ion-conductive electrolyte layers. Accordingly, it would be desirable to develop a display device and method for making such a display device having closely spaced electrochromic dots which would also minimize the cross talk effect.

SUMMARY OF THE INVENTION

In accordance with the present invention, an electrochromic display matrix and method for making the same are provided wherein relatively small spacing distances between the individual electrochromic elements are obtainable, and wherein cross talk is substantially eliminated. The electrode and counter-electrode material is formed in narrow strips as small as 0.017" wide, and spacing distances as small as 0.003" wide have been obtained. Resolutions such that a 5×7 dot segment of the display matrix can be as small as 0.097" by 0.137", i.e. the size of a typewriter size character, are obtainable.

The method according to the invention comprises exposing photoresist through a pattern which defines narrow strips and narrow spacing distances. The photoresist is developed, leaving very thin bands of photoresist. Next, ion-conductive material (polymer electrolyte) and counter-electrode material are applied over the photoresist and allowed to dry. A photoresist remover is then applied, which releases the narrow strips of photoresist and also lifts off narrow strips of ion-conductive material and counter-electrode material, to obtain narrow gaps or spaces, as small as 0.003" in width, between strips of ion-conductive material, and between the strips of counter-electrode material. Insulating paint is then applied, which fills the narrow gaps and serves to maintain isolation between the strips and substantially eliminate any cross talk when the device is addressed by a multiplexing method.

Numerous other advantages and features of the invention will become readily apparent from the following detailed description of the method according to the invention and of one embodiment thereof, from the claims and from the accompanying drawing.

DETAILED DESCRIPTION OF THE PREFERRED EMBODIMENT

Figure 1:
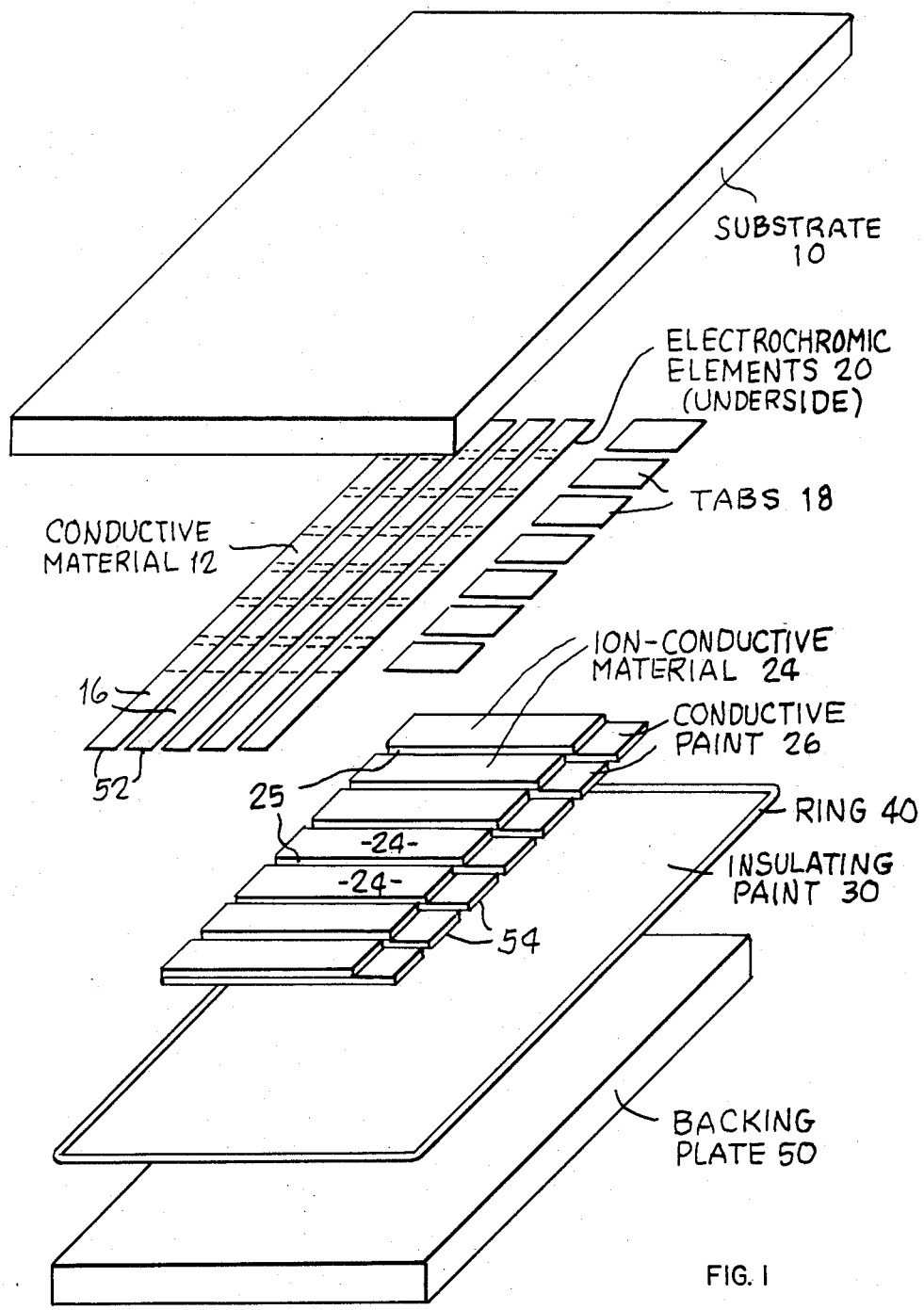
FIG. 1 shows, in perspective view, an electrochromic display matrix in accordance with the invention, but in exploded view to aid in illustrating the method of manufacture.

While this invention can be embodied in many different forms, there is shown in the drawing, and will herein be described in detail, one specific method with the understanding that the present disclosure is to be considered as an exemplification of the principles of the invention and is not intended to limit the invention to the precise method illustrated.

The method according to the invention will be described below, but first a brief description of the elements comprising the final display matrix will be helpful.

The assembly comprises a layer of substrate glass 10 which is transparent. A conductive material 12 such as tin oxide ($SnO_2$) is disposed beneath the glass 10 in a number of closely spaced columns or bands 16. Tin oxide coated transparent glass is commercially available as a product known as NESA glass. Short terminal tabs 18 of the conductive material are also disposed adjacent the outer edge of one of the columns 16 and form part of the counter-electrode. In the illustrated assembly, the number of columns is five and the number of rows is seven so that the overall assembly forms a five by seven matrix display which is a commonly used proportion for displaying alpha-numeric characters. While the conductive material tin oxide 12 is continuous along each column 16, electrochromic material segments 20, preferably of tungsten oxide ($WO_3$), are disposed beneath each column 16. The segments also form rows in alignment with the short terminal tabs 18.

Disposed beneath the tin oxide and tungsten oxide material are rows 24 of ion-conductive polymer electrolyte material. Each row 24 of material begins at one edge of the outermost columns 16 of conductive material and terminates at the other edge of the other outermost column 16 of conductive material. Accordingly, none of this ion-conductive polymer electrolyte material is disposed beneath the short terminal tabs 18. The polymer electrolyte rows 24 are in a closely spaced arrangement, being separated by narrow gaps 25.

Next in order, beneath the polymer electrolyte strips or rows 24, are rows 26 of conductive material. This conductive material preferably is carbon paint, the rows 26 of which are longer than the rows 24 of polymer above it and extend to the rightmost edge of the short terminal tabs 18. The width of the rows 26 of conductive material and the spacing between the rows should be substantially the same as the row width and gap width of the polymer electrolyte material.

Disposed beneath the rows 26 of conductive material is a layer of insulating material 30, which preferably is epoxy paint. As will be discussed below, this insulating material 30 is intended to fill the spacing or gaps 25 between the rows 26 of conductive material, and between the rows 24 of polymer electrolyte ion-conductive material. A plastic ring 40 is provided to contain and form an outside border around the insulating material 30. A layer of backing material 50, preferably glass, and an epoxy edge seal completes the entire assembly.

By employing the method according to the invention, to be described below, a spacing of 0.003 inches between columns and rows can be achieved. Also, the width of the columns 16 and of the rows 20 can be as small as 0.017 inches. Therefore, by using the method according to the invention, the overall size of a 5×7 dot matrix display segment can be as small as 0.097 inches by 0.137 inches, comparable to the size of typewriter sized characters. Of course, larger width columns and rows and larger spacing distances or gaps can be used for larger sized dot matrix characters, and the number of rows and columns in the matrix can be increased to provide the desired matrix size and resolution.

Figure 2:
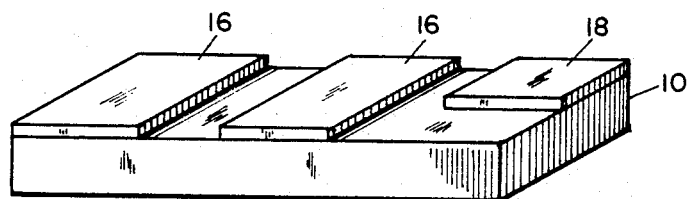
FIGS. 2-5 show a small section of the matrix illustrating how the layers are built up by the method of the invention.
Figure 3:
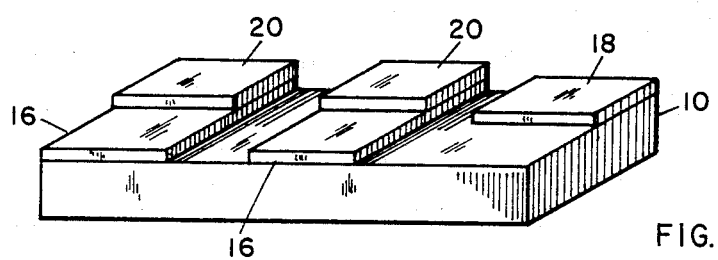

The dot matrix display illustrated in FIG. 1 is produced as follows. A conductive substrate, preferably comprising a conductively coated transparent glass, such as NESA glass, is photoetched to form a series of separate columns 16 and short terminal tabs 18 of conductive material. FIG. 2 shows one tab 18 and parts of two columns 16 on the substrate 10. The conductive coating preferably is tin oxide ($SnO_2$). Next, electrochromic material, preferably tungsten oxide ($WO_3$), is deposited by a vacuum method through a mask onto the columns 16 of tin oxide to form a pattern of dots having at least two columns and at least two rows. FIG. 3 shows two dots 20 and the tab member in one row, and the gap which separates this row from the next.

Figure 4:
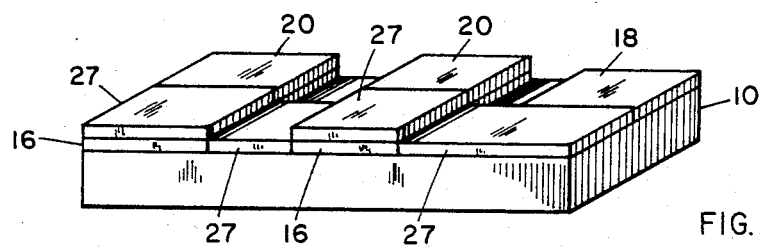

Photoresist material (Shipley AZ111 e.g.) is then spin or dip-coated onto the electrode plate and dried. A film mask having a pattern of rows is placed over the photoresist and which is then exposed to ultra-violet light. Of course, either negative working photoresist or positive working photoresist can be used, depending upon the type of film mask employed. The mask is then removed and the photoresist is developed (Shipley AZ303A developer e.g.) to remove the exposed films, leaving rows of photoresist 27 arranged at right angles to the columns 16 and between the dots 20 of electrochromic material. FIG. 4 shows one strip of photoresist 27 in the gap which separates rows of dots and tabs.

An edge mask which covers the edge seal zone and the short terminal tabs 18 of conductive material (for the counter-electrode) is applied to the substrate. In other words, all but the area including the rows and columns, and the area between adjacent rows and adjacent columns is covered by the edge mask. An ion-conductive layer is then applied through the mask to the substrate beneath. In the preferred embodiment the ion-conductive material is opaque and is preferably a mixture of HEM (hydroxyethylmethacrylate) AMPS (2-acrylamido-2-methylpropanesulfonic acid) copolymer containing 10% to 20% pigment (based upon overall polymer weight), cross-linking agent and solvent. The mixture can be applied by spin coating or spraying or any other suitable method. The ion-conductive material is allowed to dry, after which the edge mask is removed and a second mask applied which covers only the edge seal zone. In other words, the area exposed by the second mask is not only the area including the rows and columns and the area between the adjacent rows and adjacent columns, but also the area of the terminal tabs 18 inside of the edge seal. A conductive material is then applied through the second mask and onto the underlying assembly. The conductive material is preferably a carbon paint, e.g. either Acheson Electrodes 502 or a mixture of 30% Cabot XZ72R carbon and 70% Peterson Co. clear epoxy paint. The assembly is then heated to 70° C. for approximately one hour to remove any solvents.

Figure 5:
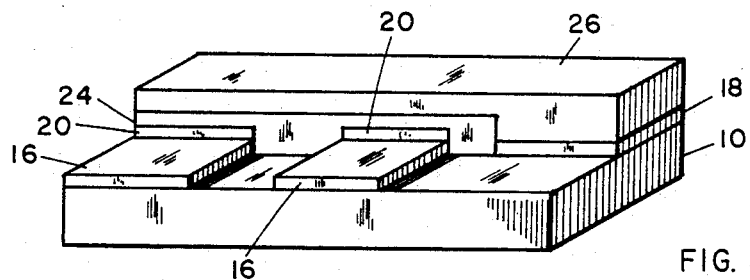

The assembly is then rinsed by applying photoresist remover (Shipley 1112A e.g.), which will release the lines of photoresist and also carry off the polymer electrolyte ion-conductive material and conductive carbon paint above the photoresist lines, to form gaps 25 and define adjacent rows 24 and rows 26. FIG. 5 shows the layers of ion conductive material 24 and conductive carbon paint 26 overlying one row of dots and tab, after removing the strip of photoresist and overlying layers from the gap between rows. Thus, by using the photoresist in the method as described above, gap spaces as small as 0.003 inches can be obtained.

As noted above, the ion-conductive material preferably comprises a copolymer, such as HEM-AMPS (hydroxyethyl methacrylate and 2-acrylamido-2-methylpropanesulfonic acid), whch is insoluble to the conductive carbon paint, but permeable to a solvent such as a photoresist remover, which can dissolve the photoresist and carry off the portions of the copolymer and conducting paint which lie directly above the photoresist. See commonly assigned U.S. Pat. No. 4,174,152 for other possible copolymers.

Next, an epoxy insulating paint 30, pigmented to match the color of the polymer electrolyte ion-conductive material is coated over the assembly. The epoxy insulating paint 30 serves to maintain the gaps 25 between the rows of copolymer 24. Otherwise, over time, the copolymer material might flow into the gaps, causing the adjacent rows 24 to touch and create alternate current paths.

The insulating paint 30 is dried, and then the edge seal zone mask (second mask) is removed. The device is then humidified at 65% relative humidity in a nitrogen atmosphere for about 24 hours. A plastic edge spacer ring 40 is then clamped between the front electrode portion, the layers formed on substrate glass 10 and a backing plate 50. The backing plate is preferably glass and has a size such that when the plate is clamped to the front glass substrate 10, the edges of the electrochromic electrode side terminals 52 are exposed along one edge and the edges of the counter-electrode terminals 54 are exposed along a second edge. An edge seal of epoxy is then applied to the edges of the overall structure to hold the backing plate and glass substrate together.

The addition of $MnO_2$ or $CrO_3$ to the conductive paint carbon counter-electrode material will make the counter electrode more electro-negative than the electrochromic layer, providing a stored charge permitting erasing of the color merely by shortcircuiting the electrode and counter-electrode.

Production by the above described method facilitates and makes economically feasible the construction of high quality, fine detail, electrochromic flat panel dot matric displays. Electrochromic dots as small as 0.017" square separated by 0.003" are possible by this method. Therefore, a five by seven matrix of rows and columns of dots can be as small as 0.097" by 0.137" which is approximately the size of a conventionally sized typewritten character. By using the above-described method, very close spacing of the rows in the X-Y matrix can be achieved with high reliability. Cross talk between the dotted points of the display is substantially eliminated.

A device constructed according to the described method can be useful in applications requiring complex character generations such as pictorial, graphic and multiline alpha-numeric displays, and is particularly useful for generating characters intended to be photocopied. Of course, while the method of construction has been described in terms of a five by seven dot matrix display, the proportions of the matrix and the number of dots in the matrix can be varied as desired, in accordance with the invention.

From the foregoing, it will be observed that numerous variations and modifications may be effected without departing from the true spirit and scope of the novel concept of the invention. It is to be understood that no limitation with respect to the specific method and apparatus illustrated herein is intended or should be inferred. It is, of course, intended to cover by the appended claims all such modifications as fall within the scope of the claims.

What is claimed is:

1. A method of producing an electrochromic display device having a pattern of electrochromic elements, comprising the steps of:
    depositing electrochromic material in a pattern over a conductive substrate;
    applying photoresist material over the electrochromic material and conductive substrate;
    exposing and developing the photoresist material to obtain a photoresist pattern wherein photoresist material is left between electrochromic material elements;
    applying a solvent-permeable ion-conductive material layer over the photoresist, electrochromic material, and substrate;
    applying a layer of solvent-permeable conductive material over the ion-conductive layer; and
    applying photoresist-remover solvent over the layer of solvent-permeable conductive material to remove the photoresist pattern along with the portions of the ion-conductive layer and solvent-permeable conductive material layer overlying said photoresist pattern, thereby to establish isolated regions of ion-conductive material and solvent-permeable conductive material.

2. A method of producing an electrochromic matrix display device in layered form and having a pattern of electrochromic elements of at least two columns and two rows, comprising the steps of:
    forming at least two columns of conductive material on a substrate;
    depositing segments of electrochromic material in a row pattern over said columns, said row pattern having at least two rows;
    applying a photoresist material over the electrochromic material, substrate conductive material and substrate;
    exposing and developing the photoresist material to obtain a photoresist pattern having a strip between each row of electrochromic material;
    applying a layer of solvent-permeable ion-conductive material over the photoresist pattern;
    applying solvent-permeable conductive material over the area of said ion-conductive layer; and
    applying photoresist-remover solvent over the area of said solvent-permeable conductive material to remove lines of photoresist, ion-conductive material and solvent-permeable conductive material, and establish isolated regions of ion-conductive material and solvent-permeable conductive material according to said row pattern.

3. The method according to claim 1 or 2, further including the step of applying a layer of insulating material over said solvent-permeable conductive material.

4. The method according to claim 1 or 2, further including the step of applying a backing plate.

5. The method according to claim 1 or 2 further including the step of placing a spacer ring on the substrate and then applying a backing plate.

6. The method according to claim 1, wherein the pattern is a series of relatively closely spaced narrow bands, and wherein the photoresist pattern comprises a strip of photoresist between adjacent narrow bands.

7. The method according to claim 1, wherein the conductive substrate comprises NESA glass.

8. The method according to claim 1 or 2, wherein the solvent-permeable conductive material layer comprises conductive paint.

9. The method according to claim 8 further including the step of heating the conductive paint after the application thereof to remove solvents.

10. The method according to claim 3 wherein the insulating material comprises epoxy paint.

11. The method according to claim 4 further including the step of humidifying the device before applying the backing plate.

12. The method according to claim 11 wherein the step of humidifying the device comprises humidifying the device in a nitrogen atmosphere.

13. The method according to claim 4 wherein the backing plate comprises glass.

14. The method according to claim 1 or 2 wherein the electrochromic material comprises tungsten oxide.

15. The method according to claim 1 or 2 wherein the ion-conductive material comprises a HEM-AMPS copolymer.

16. The method according to claim 15 wherein the ion-conductive material also comprises a cross-linking agent and solvent.

17. The method according to claim 1 or 2 wherein the ion-conductive material is pigmented.

18. The method according to claim 3 wherein the ion-conductive material is pigmented and wherein the insulating material is paint which is pigmented to match the color of the ion-conductive material.

19. The method according to claim 1 or 2 wherein the layer of ion-conductive material is opaque.

20. The method according to claim 2 wherein the size of the matrix display is five elements by seven elements.

21. The method according to claim 1 or 2 wherein the step of depositing electrochromic material comprises vacuum depositing the material through a mask.

22. The method according to claim 4 further including the step of applying an edge seal of epoxy to bind the substrate and backing plate.

* * * * *